(12) United States Patent
Gräser-Ulrich et al.

(10) Patent No.: US 12,156,421 B2
(45) Date of Patent: Nov. 26, 2024

(54) METHOD FOR MANUFACTURING A DISPLAY DEVICE AND DISPLAY DEVICE

(71) Applicant: VIA optronics GmbH, Schwarzenbruck (DE)

(72) Inventors: Anna Gräser-Ulrich, Pommelsbrunn (DE); James Joseph Kornacki, Dearborn, MI (US)

(73) Assignee: VIA OPTRONICS GMBH, Schwarzenbruck (DE)

( * ) Notice: Subject to any disclaimer, the term of this patent is extended or adjusted under 35 U.S.C. 154(b) by 398 days.

(21) Appl. No.: 17/725,983

(22) Filed: Apr. 21, 2022

(65) Prior Publication Data
US 2023/0345759 A1 Oct. 26, 2023

(51) Int. Cl.
*H10K 50/842* (2023.01)
*B32B 7/023* (2019.01)
*B32B 27/28* (2006.01)
*G02F 1/1333* (2006.01)
*H10K 102/00* (2023.01)

(52) U.S. Cl.
CPC ......... *H10K 50/8428* (2023.02); *B32B 7/023* (2019.01); *B32B 27/283* (2013.01); *B32B 2307/418* (2013.01); *B32B 2457/20* (2013.01); *G02F 1/133308* (2013.01); *H10K 2102/311* (2023.02)

(58) Field of Classification Search
CPC ......... H10K 50/8428; H10K 2102/311; H10K 50/84; H10K 59/87; H10K 71/50; H10K 77/111; B32B 7/023; B32B 27/283; B32B 2307/418; B32B 2457/20; G02F 1/133308
See application file for complete search history.

(56) References Cited

U.S. PATENT DOCUMENTS

2018/0339546 A1* 11/2018 Ito .................. B32B 27/308
2022/0011619 A1* 1/2022 Park ................ B60J 1/001

* cited by examiner

*Primary Examiner* — Donald L Raleigh
(74) *Attorney, Agent, or Firm* — McGlew and Tuttle, P.C.

(57) ABSTRACT

Methods for manufacturing a display device and display devices are described. A display substrate having a display surface, wherein the display surface has a first surface curvature, and a cover having a cover surface, wherein the cover surface has a second surface curvature different from the first surface curvature, are provided. A spacer is provided. The spacer has a first spacer surface having a first spacer surface curvature being adapted to the first surface curvature and a second spacer surface having a second spacer surface curvature being adapted to the second surface curvature. The spacer is attached to the cover so that the second spacer surface faces the cover surface. The spacer is attached to the display substrate so that the first spacer surface faces the display surface.

22 Claims, 3 Drawing Sheets

METHOD FOR MANUFACTURING A DISPLAY DEVICE AND DISPLAY DEVICE

FIELD OF THE INVENTION

The present inventive technology relates to a method for manufacturing a display device, in particular a curved display device. The inventive technology further relates to a display device, in particular a curved display device.

BACKGROUND OF THE INVENTION

Display devices, in particular display devices having a display cover with a curved surface and methods of producing such display devices are known from the prior art. Display devices having a curved cover surface are also referred to as curved display devices or curved displays.

SUMMARY OF THE INVENTION

It is an object of the present inventive technology to provide an improved method for manufacturing a display device, in particular to provide an easy and reliable manufacturing method with which the stability and optical properties of the manufactured display device can be improved.

This object is achieved by a method for manufacturing a display device comprising the steps of
- providing a display substrate having a display surface, wherein the display surface has a first surface curvature,
- providing a cover having a cover surface, wherein the cover surface has a second surface curvature different from the first surface curvature,
- providing a spacer having a first spacer surface and a second spacer surface, wherein the first spacer surface has a first spacer surface curvature being adapted to the first surface curvature of the display substrate and wherein the second spacer surface has a second spacer surface curvature being adapted to the second surface curvature of the cover surface,
- attaching the spacer to the cover so that the second spacer surface faces the cover surface, and
- attaching the spacer to the display substrate so that the first spacer surface faces the display surface.

A display substrate having a display surface, wherein the display surface has a first surface curvature, is provided. A cover having a cover surface, wherein the cover surface has a second surface curvature different from the first surface curvature, is provided. A spacer having a first spacer surface and a second spacer surface is provided. The first spacer surface has a first spacer surface curvature being adapted to the first surface curvature of the display substrate and the second spacer surface has a second spacer surface curvature being adapted to the second surface curvature of the cover surface. The spacer is attached to the cover so that the second spacer surface faces the cover surface. The spacer is attached to the display substrate so that the first spacer surface faces the display surface. The method results in a display device, wherein the spacer is positioned between the display substrate and the cover. Due to the different surface curvatures of the cover surface and the display surface, display devices with a large variety of shapes can be manufactured. In particular, the cover can have a bent or curved surface, so that a curved display device can be manufactured. The spacer functions as an adapter between the display surface and the cover surface, in particular between their different surface curvatures. The spacer may also be referred to as cover adapter. The spacer stabilizes the shape of the cover, in particular the second surface curvature of the cover surface, irrespective of the shape of the display substrate, in particular of the first surface curvature of the display surface. The method is easy as well as flexible and results in a robust display device. The method is particularly suitable for manufacturing display devices with a curved or bent cover.

The provision of the display substrate, the transparent cover and/or the spacer can comprise the manufacture of the respective component.

The method steps of the claimed method do not necessarily have to be executed in the above-specified sequence. For example, the spacer may first be attached to the display substrate and later to the transparent cover. It is also possible that the transparent cover and/or the display substrate are provided, in particular manufactured, after the spacer has been attached to the respective other component. For example, the spacer may be attached to the display substrate and later the transparent cover is provided and attached to the spacer.

It is also possible that two of the steps are combined in one step. For example, the provision of the display substrate and/or the transparent cover may be combined with the attachment of the spacer to the respective component. For example, it is possible that the transparent cover is provided, in particular manufactured, and attached to the spacer other in single step. In particular, the transparent cover and the spacer may be provided, in particular manufactured, and attached to each other in a single step. For example, the transparent cover and the spacer can be manufactured as combined component, e.g. by injection molding, in particular by 2-component injection molding. This safes production steps and costs.

In the sense of the present inventive technology, the surface curvature determines whether and how a surface is curved. The surface curvature may for example be locally quantified by a curvature metric, e.g. by the Gaussian curvature or by the mean curvature, being defined for each point on the surface. The surface may be flat or plane, resulting in a vanishing or zero surface curvature. For example, a vanishing surface curvature may have a curvature metric which is substantially zero for every point of the surface. The surface may be curved, resulting in a finite surface curvature. A bent surface may have a curvature metric which is non-zero at every point of the surface. The surface may, in particular, be constantly bent, for example having a curvature metric which is the same for all points of the surface. The surface curvature can vary over the surface. For example, the surface can be flat in some surface sections and curved in other surface sections. The surface curvature can in particular change sign leading to a curving of the surface in different directions. The surface curvature may be different in different directions. In particular, the principal surface curvatures at a given point may be the same or differ. For example, the surface may be differently bent in different directions, e.g. having a finite surface curvature in one direction and a vanishing surface curvature in another direction.

The first surface curvature of the display surface and the second surface curvature of the cover surface are different. In the sense of the present inventive technology, different surfaces are understood to have different surface curvatures if the respective surfaces are differently curved or bent in at least one complementary surface section. Complementary surface sections are surface sections of the respective surfaces, which, in the manufactured display device, lay above each other when seen from a front of the display. Being differently bent or curved, in particular, means that the respective complementary surface sections cannot be placed on top of each other without creating a varying spacing in between the surfaces. In this sense, it is possible that the surface curvature of different surfaces may not be considered different, despite an at least local difference in the respective curvature metric. For example, two surfaces may be curved in one direction in form of a circular arc. Two circular arcs, which have different radii but the same center, result in different Gaussian curvatures. These arcs, however, may be aligned with a constant spacing, being the difference in radius, and are hence not differently curved or bent in the above sense. In contrast, two circular arcs having the same radius but different center points result in the same Gaussian curvature. The displacement of the center points may lead to a varying spacing and to different surface curvatures in the above sense.

In the manufactured display device, the surfaces of different display components, in particular the display surface of the display substrate and the cover surface of the cover, are spaced from each other by a spacing. The spacing may also be referred to as gap size. Due to different surface curvatures, the spacing between the cover surface and the display surface varies for different points on the respective surfaces. A varying spacing is, in particular, to be understood as a spacing which varies by an amount exceeding variations in spacing which are due to limited production accuracy and/or unwanted warping of parts. In particular, the variation of the spacing due to different surface curvatures exceeds variations due to production accuracy by at least one order of magnitude, in particular by at least two orders of magnitude. The variation in spacing due to different surface curvatures may be 2% or more, in particular 5% or more, in particular 10% or more, in particular 15% or more of a display diagonal of the display device.

The first surface curvature and the second surface curvature may be different in one or more complementary surface sections of the display surface and the cover surface. The first surface curvature and the second surface curvature may substantially coincide in other complementary surface sections. It is also possible that the first surface curvature differs from the second surface curvature over the complete surface area of the display surface and cover surface, respectively. For example, the display surface or the cover surface is flat while the other has a finite surface curvature. In particular, the display substrate may be plate-like, having a flat display surface. The second surface curvature of the cover surface may finite. Preferably, the display surface has a substantially vanishing first surface curvature and the cover surface has a finite second surface curvature. Particularly preferable, the display surface is flat and the cover surface is curved, in particular is curved without changing the direction of curvature.

The first spacer surface curvature and the second spacer surface curvature are adapted to the first surface curvature of the display surface and the second surface curvature of the cover surface, respectively. In particular, the first spacer surface curvature corresponds to the first surface curvature of the display surface and/or the second spacer surface curvature corresponds to the second surface curvature of the cover surface. Having adapted surface curvatures, in particular, means that the respective surfaces are fitted to be placed on top of each other during manufacturing of the display device. Preferably, having adapted surface curvatures means that the respective surfaces can be placed on top of each other with a substantially constant spacing. A substantially constant spacing is to be understood to not vary substantially, in particular, variations in spacing which are 2% or less, in particular 1% or less, of the display diagonal of the display device, are not considered substantial. For example, variations, which are due to production accuracy and/or unwanted warping of parts, may not be considered substantial. In the context of the present inventive technology, two surfaces may have corresponding surface curvatures despite differing in at least one surface metric. Preferably, the first spacer surface curvature is adapted, in particular corresponds, to the first surface curvature over the complete surface area in which the first spacer surface faces the display surface in the manufactured display device. Preferably, the second spacer surface curvature is adapted, in particular corresponds, to the second surface curvature over the complete surface area of the cover surface in which the second spacer surface faces the cover surface in the manufactured display device.

Due to the different surface curvatures of the display surface and the cover surface, a spacing between the display surface and the cover surface varies for different points on the display surface and the cover surface. Using conventional bonding methods, this requires a different thickness of the bonding material at different positions of the bondline. Such bonding techniques are time-consuming and prone to production errors. In particular, the application of a high amount of bonding material, which is required in areas with a large spacing between the cover surface and the display surface, increases the risk of contamination of the bonding material, in particular with fuzz and/or gas bubbles. Such production errors and contaminations are reliably avoided by positioning the spacer between the cover and the display substrate. The spacer works as an adapter between the differently curved surfaces, obviating thick layers of bonding material. Avoiding contamination in particular improves the optical properties of the display device. Moreover, yellowing and/or color shifts, which may occur in thicker layers of bonding material, are avoided. A further advantage lies in the improved efficiency of the method. In particular, long-lasting curing of thick layers of bonding material is avoided. Further, it is not necessary to provide a dam or other kind of barrier for the bonding material. The method is reliable and efficient.

A further advantage of the inventive method lies in the increased stability of the manufactured display device. The spacer stabilizes the connection between the cover and display substrate. This is of particular relevance for bezel-less and/or frameless displays.

The display surface in the sense of the inventive technology is to be understood as the surface on which information is displayed to the user during usage of the manufactured display device. The display substrate can comprise a display layer for displaying information, e.g. an LCD layer, an OLED layer and/or an AMOLED layer. The display surface may at least partially be realized by an emitter surface of the display layer. The display surface may be curved. For example, the display surface can have a finite surface curvature. In particular, the display substrate may be bendable. The first surface curvature of the display substrate can then be easily modified for the specific use case. Preferably, the display surface is flat. For example, the display substrate as a whole may have a flat or plate-like geometry. This has the advantage that conventional display modules may be used as display substrate.

In the manufactured display device, the display surface may be viewable via the cover. A user of the manufactured display may view information displayed on the display surface via the cover. The cover is in particular a transparent cover. The cover may or may not have a hue and/or shading.

The cover may, in particular, be made of glass. Such a cover may also be referred to as cover glass. Suitable glasses are in particular soda lime glass, float glass, borosilicate glass and/or (alkali-)aluminosilicate glass. The cover is robust and scratch-resistant.

The cover surface of the cover faces the display surface in the manufactured display device. Opposite to the cover surface, the cover may comprise a viewing surface which faces a user of the manufactured display device during usage of the display device. The viewing surface may in particular be an outer surface of the display device. The cover may be a protective cover, in particular a scratch-resistant protective cover. The viewing surface and the cover surface of the cover may have a different surface curvature or a corresponding surface curvature, in particular substantially the same surface curvature. Preferably, the viewing surface and the cover surface are similarly, in particular substantially identically, curved. For example, the cover may have a constant thickness. The surface curvature of the viewing surface, may determine the outer surface curvature of the display device.

The cover, in particular its cover surface and/or viewing surface, may be curved in one or more directions. Different sections of the cover, in particular different surface sections of the cover surface and/or the viewing surface, may be differently curved, in particular curved in different directions. While some surface sections of the cover surface may be planar, the cover surface as a whole preferably does not have a flat or plate-like geometry. Particularly preferably, the cover as a whole has a convex or concave shaped geometry when seen from the viewing surface. The display device may have a convexly or concavely curved cover.

During usage of the manufactured display device, the display substrate may be viewable through the spacer. Using the spacer, the optical properties of the display can be adapted to, in particular optimized for, the specific use case. For example, the spacer may be formed from a transparent, in particular optically clear, material. This increases the visibility of the display surface. Additionally or alternatively, the spacer may be provided with a defined hue and/or shading. This allows for a uniform and consistent coloring of the front of the display, in particular to realize a uniform black coloring of the display front, a so-called dead front display device. For example, the spacer may comprise pigments for providing a defined hue and/or shading. It is also possible to control the hue and/or shading, e.g. by using electrochromic and/or photochromic materials and/or components in the spacer and/or attached to the spacer.

The spacer may additionally or alternatively comprise one or more functional foils. For example, the spacer may comprise one or more electrochromic and/or photochromic foils. Using electrochromic and/or photochromic foils, the shading and/or hue of the spacer can be flexibly adjusted.

The spacer may comprise means for controlling the temperature. In particular, the spacer may act as a heat sink, e.g. for transporting heat away from the display substrate. For example, the spacer may comprise a material of high thermal conductivity. Additionally or alternatively, the spacer may comprise active cooling.

Preferably, the spacer may have a refractive index similar to the refractive index of the cover glass. This way, reflections and distortions between the different display device components may be reduced. Particularly preferably, the spacer may be made of the same material as the cover, in particular as the cover glass.

According to a preferred aspect of the method, providing the spacer comprises preforming the spacer from glass, plastic and/or a durable bonding material. Preforming the spacer has the advantage that the shape of the spacer, in particular the surface curvatures of the first and second spacer surface, can be precisely adapted to the specific use case. The spacer may also be referred to as preform. Being preformed, the display has a defined shape. The spacer is preferably in form of a solid body. Preferably, the spacer can be made in one piece from a single material. It is also possible that the spacer is preformed from different materials. For example, different spacer segments may be made of different materials. Different spacer segments, in particular spacer segments made of different materials, may be connected to a one-piece spacer prior to attaching the spacer to the cover and the display substrate. Alternatively, different spacer segments may form separate spacer parts individually attached to the cover and the display substrate, in particular in different surface sections of the cover and the display.

Preforming the spacer from glass has the advantage of high optical qualities. Further, the spacer is particularly stable and resistant to external influences, e.g. UV radiation. Particularly preferably, the spacer may be formed of the same kind of glass as the cover. This way, the optical properties of the cover and the spacer, in particular the refractive index, match. Reflections and distortions are reduced. Particularly suitable glasses are soda lime glass, float glass, borosilicate glass and/or (alkali-)aluminosilicate glass.

Spacers comprising plastic have a low weight and are cost-efficiently producible. Plastic materials can be easily processed to preform the spacer. Suitable plastics are in particular thermoplastics. Thermoplastics can be easily shaped to preform the spacer. Particularly suitable plastics are polymethylmethacrylate (PMMA), also referred to as acrylic glass, and/or polycarbonate (PC).

Preforming the spacer from a curable bonding material allows for a particularly flexible method, in particular for flexibly adapting of the shape of the spacer to the respective use case. Preforming the spacer in particular comprises curing, preferably completely curing, the curable bonding material. The preformed spacer can be easily further processed. A change of material between the spacer and a further bonding material, which may for example be used to bond the spacer to the display substrate and/or the cover glass, is avoided. The spacer may preferably preformed from silicone resin. A particularly suitable silicon resin may comprise an inorganic silicon-based optical bonding material, in particular an inorganic silicon-based two-component optical bonding material, such as, for example, "VIA Bond" or "VIA Bond Plus" of VIA optronics.

The spacer may be for example preformed by using a mold. The material from which the spacer is preformed may for example be filled in the mold and cured to form the spacer. Using a mold allows preforming the spacer in an easy and controlled manner, in particular preforming the spacer with a defined surface curvature of the first and second spacer surface. Using a mold is particularly suitable for preforming the spacer from a curable bonding material.

According to a preferred aspect of the method, preforming the spacer comprises forming spacer segments, in particular spacer layers, having different optical properties, in particular different refractive indices. This allows for locally varying the optical properties, in particular locally varying the refractive index, of the spacer. Locally varying optical properties allow for adapting different optical properties of different components of the display device, in particular the cover and the display substrate. Optical distortions caused by different surface curvatures and a varying thickness of the spacer, can be reduced. Particularly advantageously, the refractive index can be gradually adapted to minimize refraction phenomena.

Different spacer segments can in particular be formed in the form of spacer layers. The spacer may have a layered structure having two or more spacer layers. Different spacer layers may be formed from different materials. Spacer layers are particularly suitable to vary the optical properties in a direction from the cover to the display substrate.

Different spacer segments, in particular different spacer layers, may be formed by consecutively applying different materials to a mold. For example, different bonding materials may be consecutively applied to a mold to form different spacer layers. Preferably, the applied bonding material is at least partially cured before a further bonding material is applied to form a further spacer layer.

Preferably, active components can be placed between different spacer segments. In particular, active layers may be layered between different spacer layers. Suitable active layers comprise, but are not limited to touch sensor substrates and/or functioning foils, such as electrochromic or photochromic foils.

According to a preferred aspect of the method, at least one spacer segment comprises a high refractive index material, in particular a phenyl silicone. A high refractive index material allows for a particularly effective adaption of the optical properties. Phenyl silicone is a particularly suitable high refractive index material.

According to a preferred aspect of the method, providing the cover comprises bending the cover to obtain the second surface curvature of the cover surface. The method is efficient and flexible. The second surface curvature can be easily adapted to the respective use case. For example, the cover may be provided with an initial surface curvature which differs from the second surface curvature of the cover surface. In general, the cover may be provided with any initial surface curvature which allow bending the cover to obtain the second surface curvature of the cover surface. Preferably, the cover is provided in a substantially planar shape. The provided cover can be easily handled. Preparatory steps can be performed with machinery used for the manufacture of planar display covers. Equipment expenses are reduced.

Particularly preferably, the cover is bendable in the elastic regime. The cover may be stabilized in the bent shape having the second surface curvature by attaching the spacer to the cover. The spacer works as a reinforcement structure for the bendable cover.

Preferably, the cover is provided as a cover glass, in particular as a bendable cover glass. Particularly preferably, bending of the cover is performed at temperatures below the glass transition temperature of the glass material, in particular at room temperature.

According to a preferred aspect of the method, attaching the spacer to the display substrate comprises bonding the first spacer surface to the display surface. Additionally or alternatively, attaching the spacer to the display comprises bonding the second spacer surface to the cover surface. Bonding allows for a stable and homogenous connection. Air gaps and other inclusions, which might be detrimental to the optical properties, are reliably avoided. Preferably, the respective surfaces are bonded using curable bonding material. Suitable bonding material are optically clear resin (OCR) and/or optical clear adhesives (OCA). Exemplary adhesives are silicone adhesive and/or double-sided tape.

According to a preferred aspect of the method, the spacer is mechanically attached to a display frame. Mechanical connection with a frame further stabilizes the spacer in its target position. This stabilizes the display device further. In particular, the spacer can be attached to the display substrate and/or the cover via the display frame. A delamination of different parts of the spacer is reliably avoided. A suitable display frame may comprise, in particular may be made of, aluminum. Aluminum offers a high stability at relatively low weight.

Mechanical attachment of the spacer to the frame may occur by conventional attaching means, e.g. by screws, bolts, clips, press fitting and/or by snap-in locking. Additionally and/or alternatively, a mechanical attachment may occur by clamping the spacer between the frame and the display substrate and/or the frame and the cover. In the case of a mechanical attachment of the spacer, gaps between the spacer and further components of the display device, in particular the display substrate and/or the cover, may be filled with a transparent material. This way, air gaps or other inclusions are avoided. Suitable filling materials include resins and/or adhesives, in particular durable adhesives, e.g. optical clear adhesives. Suitable filling materials are not restricted to curable materials such as resins or adhesives. Suitable filling materials may additionally or alternatively comprise liquids and/or gels. This expands the variety and flexibility of the method and the manufactured display device. In particular, suitable liquids and/or gels can be chosen, e.g. based on the aimed for refractive index, hue and/or shading. For example, liquids and/or gels may be sealed between the spacer and the transparent cover and/or the display substrate. In particular, the liquid and/or gel may be sealed around its circumference by a dam, in particular by an adhesive dam.

Preferably, the spacer may be mechanically attached to the frame and additionally bonded to the display substrate and/or to the cover. The resulting connection is particularly stable.

According to a preferred aspect of the method, the spacer comprises at least two spacer parts which each are attached to the display substrate and the cover so that different spacer parts face different surface sections of the display surface and/or the cover surface. Different spacer parts may, in particular, be separate spacer parts. Preferably, each spacer part may comprise a first and a second spacer part surface, whose surface curvatures are adapted to the first and second surface curvatures of the respective surface sections. Using a plurality of spacer parts increases the flexibility of the method. Moreover, the weight of the manufactured display device can be reduced. For example, spacer parts may only be positioned in surface sections of the cover surface and the display surface, where a spacing between the cover surface and the display surface is particularly large. No spacer may be positioned in surface sections where the spacing between the cover surface and the display surface is small, thus reducing the weight of the spacer and the manufactured display device. For example, the cover may be concavely bent in one direction, resulting in the largest spacing between the cover surface and the display surface at two opposite edges of the display device and the spacing reducing towards the middle region. One spacer part may be positioned along each edge, while in the middle region no spacer is required. Different spacer parts may have a different hue and/or shading. This way, regions of different hue and/or shading can be defined on the display. For example, different spacer parts can comprise different pigments and/or a different amount of pigments.

It is a further object of the present inventive technology to provide an improved display device, in particular a display device with an increased stability and high optical qualities.

This object is achieved by a display device obtained by the inventive method. The display device is obtained by the above-described method. The display device has the properties and advantages described with respect to the method.

This object is also achieved by a display device, comprising a display substrate having a display surface, wherein the display surface has a first surface curvature, a cover having a cover surface, wherein the cover surface has a second surface curvature different from the first surface curvature, and a spacer having a first spacer surface and a second spacer surface, wherein the first spacer surface has a first spacer surface curvature being adapted to the first surface curvature of the display substrate and wherein the second spacer surface has a second spacer surface curvature being adapted to the second surface curvature of the cover surface, wherein the spacer is attached to the display substrate so that the first spacer surface faces the display surface, and wherein the spacer is attached to the cover so that the second spacer surface faces the cover surface.

The display device comprises a display substrate having a display surface, wherein the display surface has a first surface curvature. The display device further comprises a cover having a cover surface, wherein the cover surface has a second surface curvature different from the first surface curvature. The display device further comprises a spacer having a first spacer surface and a second spacer surface, wherein the first spacer surface has a first spacer surface curvature being adapted to, in particular corresponding to, the first surface curvature of the display surface and wherein the second spacer surface has a second spacer surface curvature being adapted to, in particular corresponding to, the second surface curvature of the cover surface. The spacer is attached to the display substrate so that the first spacer surface faces the display surface and the spacer is attached to the cover so that the second spacer surface faces the cover surface. The spacer serves as an adapter between the display substrate and the cover. The spacer thus stabilizes the structure of the display device. Further, the spacer allows for improved optical properties, in particular avoiding detrimental effects of thick layers of bonding materials, e.g. contaminations by fuzz and/or gas bubbles and or yellowing. The display device may in particular be manufactured by the above-described method. Further details and advantages of the display device may correspond to those described above with respect to the manufacturing method.

In particular, the display device may comprise a curved cover. The display device may be curved display device. Preferably, the display surface may be flat or planar. The display preferably combines a flat display substrate with a curved cover.

The display device may further comprise a touch sensor. The touch sensor may be provided as a part of the cover, the spacer and/or the display substrate. For example, a touch sensor substrate may be provided on the cover surface of the cover.

According to a preferred aspect of the display device, the spacer is made from glass, plastic and/or curable bonding material. Preferably, the spacer is made from glass and/or plastic. The properties of the spacer and the display device can be flexibly adapted by the suitable material choice.

According to a preferred aspect of the display device, the first spacer surface is bonded to the display surface and/or the second spacer surface is bonded to the cover surface. The connection between spacer and display surface and/or cover surface is reliable and has high optical quality.

According to a preferred aspect of the display device, the display device further comprises a display frame, wherein the spacer is mechanically attached to the display frame. The display frame further stabilizes the display device. Delamination of the display device is reliably avoided. A suitable display frame may comprise, in particular may be made of, aluminum. Aluminum offers a high stability at relatively low weight.

According to a preferred aspect of the display device, the spacer comprises at least two spacer segments, in particular at least two spacer layers, having different optical properties, in particular different refractive indices. The optical properties of the spacer vary locally. Thus, the optical properties, in particular the refractive index of the spacer, can be particularly suitably adapted to the respective use case. Advantageously, the optical properties of the spacer can be gradually modified, in particular to match different optical properties of the cover and the display substrate.

According to a preferred aspect of the display device, the spacer comprises at least two spacer parts, wherein different spacer parts are positioned to face different surface sections of the display surface and/or different surface sections of the cover surface. Different spacer parts may, in particular, be separate from each other. The display device has a light weight at flexible configuration.

The above-described method and display device comprise a transparent cover being attached to the spacer or cover adapter. Such an additional cover is however not necessarily required to achieve the benefits of the spacer. For example, instead of providing an additional cover, it is possible to combine the functions of cover and spacer in a single component, in particular an outer surface or viewing surface of the display device can be provided by the spacer or preform. It is an independent aspect of the inventive technology to provide a method for manufacturing a display device and a display device, in which the functions of cover and spacer are combined in a single component. Here and in the following, a component combining the functionalities of spacer and cover is referred to as front piece. For example, a front piece may be provided which has a first front piece surface and a second front piece surface. The first front piece surface has a first front piece surface curvature being adapted, in particular corresponding, to the first surface curvature of the display surface. The second front piece surface has a second front piece surface curvature being different from the first front piece surface curvature. Attaching the front piece to the display substrate so that the first front piece surface faces the display surface, results in a display device without requiring an additional cover. The second front piece surface forms the outer surface of the display device. The surface curvature of the second front piece surface and with that the surface curvature of the outer surface of the display device is independent of the surface curvature of the display substrate. Not having to attach an additional cover further simplifies the manufacturing method and reduces the costs of the display device, in particular of a curved display device. The front piece may have any of the properties and advantages of the spacer discussed above. In particular, the front piece may be provided in form of a preform. Advantageously, the front piece may be made of a scratch-resistant material. In particular, the preform may be made of glass, preferably soda lime glass, float glass, borosilicate glass and/or (alkali-) aluminosilicate glass. It is also possible that the front piece comprises a transparent cover and a spacer which are integrally manufactured, e.g. by injection molding.

As described above, the spacer is used as an adapter to compensate the varying spacing between the display surface and the cover surface. The varying spacing may be caused by different surface curvatures. Different surface curvatures are particularly advantageous to allow for a wide variety of display devices. Having different surface curvatures is, however, not mandatory to profit from the benefits of the spacer. It is an independent aspect of the inventive technology to provide a display device and a method for manufacturing a display device, in which a spacer is positioned and attached between a display surface and a cover surface to match a varying spacing between the display surface and the cover surface. The matching of the varying spacing may be achieved independently of the cause for the varying spacing. In particular, it is not required that the variation in spacing occurs due to different surface curvatures of the display surface and the cover surface. For example, cover surface and display surface may be flat.

The spacing between the cover surface and the display surface may vary from one edge of the display device to the other due to an inclination or tilting between display surface and cover surface.

Further details, features and advantages of the inventive technology are obtained from the description of exemplary embodiments with reference to the figures.

DESCRIPTION OF THE PREFERRED EMBODIMENTS

Figure 1:
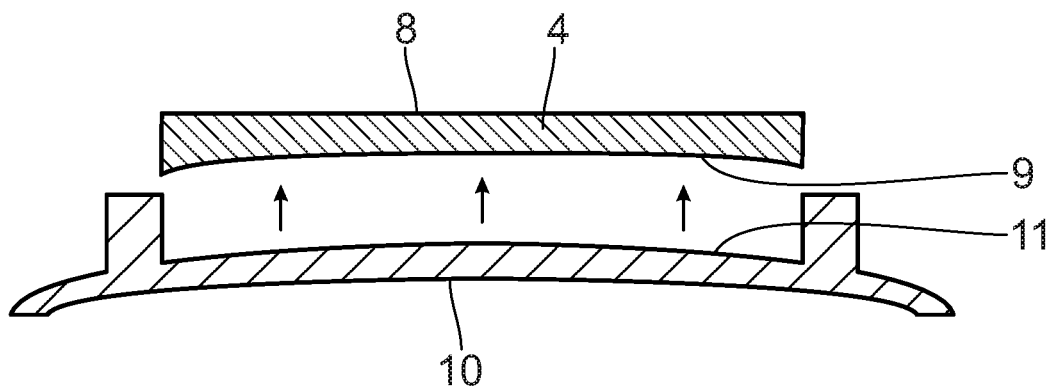
FIG. 1 shows a schematic depiction of a method step of preforming a spacer for the manufacture of a display device.
Figure 2:
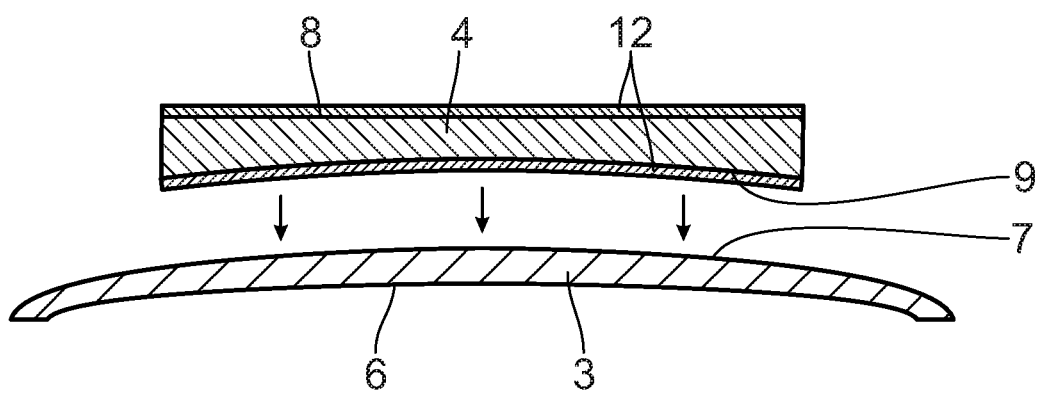
FIG. 2 shows a schematic depiction of a method step of attaching the preformed spacer to a cover.
Figure 3:
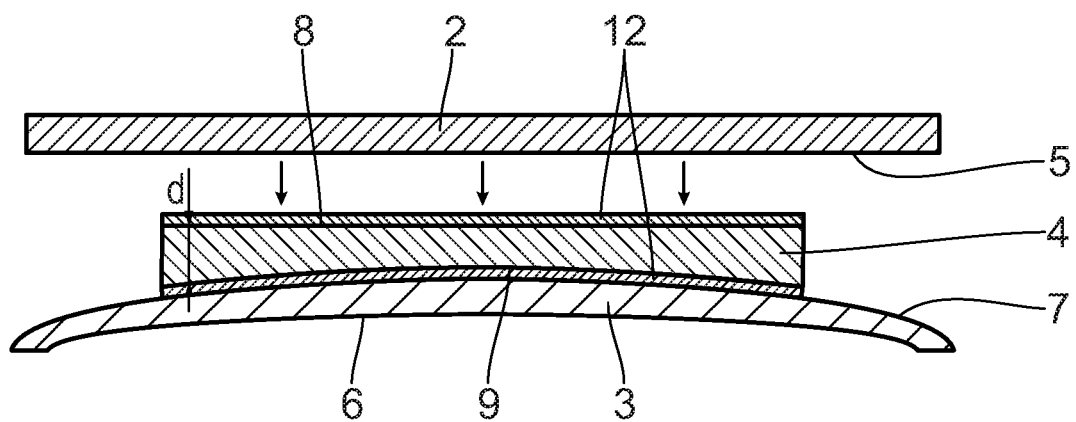
FIG. 3 shows a schematic depiction of a method step of attaching of a display substrate to the preformed spacer.
Figure 4:
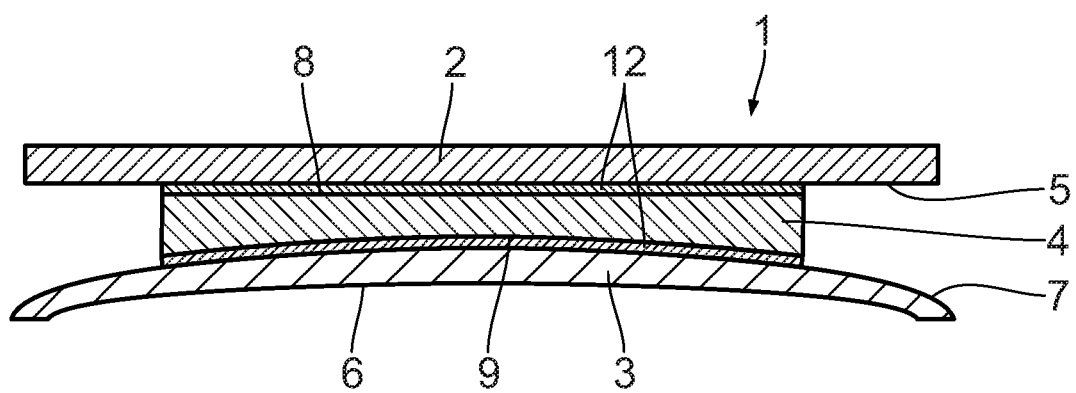
FIG. 4 shows a schematic depiction of a display device manufactured in accordance with the method steps shown in FIGS. 1 to 3.

A first embodiment of a display device 1 and its manufacturing process is described with reference to FIGS. 1 to 4. FIGS. 1 to 3 schematically depict different method steps of the manufacturing process. FIG. 4 schematically depicts the manufactured display device 1.

The display device 1 comprises a display substrate 2 and a transparent cover 3 in the form of a cover glass. The display substrate 2 is connected with the cover 3 via a spacer 4.

The display substrate 2 comprises a display surface 5. During usage of the display device 1, information is displayed to a user on the display surface 5. The display surface 5 is realized by a display layer, e.g. by an LED layer, an OLED layer and/or an AMOLED layer. The display surface 5 has a first surface curvature. In the shown embodiment, the display layer 5 is flat. In other words, the first surface curvature of the display surface 5 is substantially zero.

During usage of the display device 1, the display surface 5 is viewed via the cover 3 and the spacer 4. The cover 3 and the spacer 4 are made from a transparent material.

The cover 3 has a viewing surface 6 forming the outer surface of the display device 1. During usage of the display device 1, the viewing surface 6 faces a user of the display device 1. The cover 3 comprises a cover surface 7 opposite to the viewing surface 6. The cover surface 7 faces the spacer 4. The cover 3 is curved. When seen from the side of the viewing surface 6, the cover 3 has a concave curvature. In other embodiments, the cover 3 may be differently curved, e.g. convexly curved. The cover surface 7 has a second surface curvature which corresponds to the curved shape of the cover 3. The second surface curvature of the cover surface 7 is non-zero.

The second surface curvature of the cover surface 7 differs from the first surface curvature of the display surface 5. Due to the different surface curvatures of the display surface 5 and the cover surface 7, a spacing d between the display surface 5 and the cover surface 7 varies for different points on the display surface 5.

The spacer 4 has a first spacer surface 8 and a second spacer surface 9. The spacer 4 is attached to the display substrate 2 so that the first spacer surface 8 faces the display surface 5. The spacer 4 is attached to the cover 3 so that the second spacer surface 9 faces the cover surface 7. The first spacer surface 8 has a first spacer surface curvature which corresponds to the first surface curvature of the display surface. In the shown embodiment, the first spacer surface curvature is substantially zero, resulting in a flat first spacer surface 8. The second spacer surface 9 has a second surface curvature being adapted to the second surface curvature of the cover surface 7. In the shown embodiment, the second spacer surface curvature has a surface curvature corresponding the concavely curved cover 3. The spacer 4 serves as an adaptor between the differently curved display surface 5 and cover surface 7. This results in a particularly stable display device 1.

In the following, the method for manufacturing the display device 1 is described. The display substrate 2 and the cover 3 are provided. The spacer 4 is provided by preforming the spacer 4. FIG. 1 illustrates the provision of the spacer 4 by preforming the spacer 4 in a mold 10. As can be seen in FIG. 1, the mold 10 comprises a mold bottom surface 11 having a mold surface curvature. The mold surface curvature corresponds to the second curvature of the cover surface 7.

The spacer 4 is preformed by filling the mold 10 with suitable material. For example, the spacer may be formed of glass, plastic and/or curable bonding material. The mold 10 can be filled with a melt of the material. The material melt is hardened in the mold 10 to preform the spacer 4. For example, the mold 10 can be filled with uncured bonding material, which is cured in the mold to preform the spacer 4. After curing the bonding material, the preformed spacer 4 is taken out of the mold 10 as shown in FIG. 1.

After preforming the spacer 4, the spacer 4 is attached to the cover 3 and the display substrate 2 to form the display device 1. In the present embodiment, the spacer 4 is bonded with the cover 3 and the display substrate 2. For bonding the spacer 4, a layer of bonding material 12 is applied to the first spacer surface 8 and the second spacer surface 9, respectively. The bonding material 12 can for example be provided in the form of an optical clear resin (OCR) and/or an optical clear adhesive (OCA).

In further embodiments, the spacer is formed from a cured bonding material. Instead of applying a layer of bonding material 12, an adhesive layer can be achieved on the first spacer surface 8 and the second spacer surface 9, by selectively melting the previously cured bonding material on the respective surface. Alternatively, the curing of the bonding material during preforming the spacer can be performed so that the bonding material is not completely cured on the first spacer surface 8 and/or the second spacer surface 9.

As schematically shown in FIG. 2, the spacer 4 is attached to the cover 3. The second spacer surface 9 is bonded to the cover surface 7 via the bonding material 12.

In further embodiments, the provision of the cover 3 comprises bending the cover 3 to obtain the second surface curvature of the cover surface 7. In this case, the cover 3 can initially be provided with a different surface curvature, in particular in a flat or planar state. The cover 3 may in particular be bendable, preferably bendable in the elastic regime. In particular in such instances, the attachment of the spacer 4 may stabilize the cover 3 in the bent shape.

As schematically shown in FIG. 3, the display substrate 2 is attached to the spacer 4. The first spacer surface 8 of the spacer 4 is bonded to the display surface 5 via the bonding material 12.

Attaching the spacer 4 to the cover 3 and the display substrate 2 results in the display device 1 as shown in FIG. 4. The spacer 4 leads to a stable connection of the display substrate 2 with the cover 3, without requiring a display frame. The display device 1 can in particular be a frameless display. In further embodiments, the manufacturing process may contain additional steps in which further components of the display device, in particular a frame, are attached to the display substrate 2, the spacer 4 and/or the cover 3. In particular, the frame is mechanically attached to the display substrate 2, the spacer 4 and/or the cover 3. For example, the frame may be mechanically attached to the spacer 4.

Figure 5:
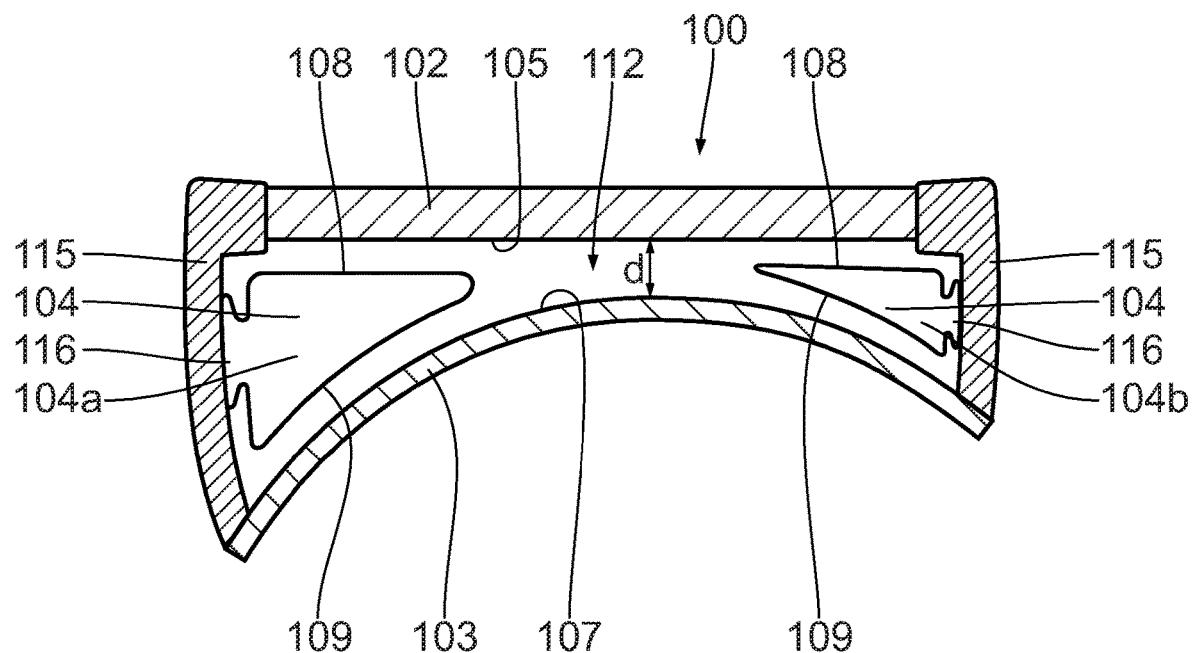
FIG. 5 shows a schematic depiction of a display device according to a further embodiment.

With reference to FIG. 5, a further embodiment of a display device 100 is shown. FIG. 5 schematically depicts a longitudinal section through the display device 100. The display device 100 comprises a display substrate 102 having a planar display surface 105. The display substrate 102 may correspond to the display substrate 2 described with reference to FIGS. 1 to 4.

The display device 100 comprises a cover 103 in the form of a cold-formed cover glass. The cover 103 is concavely curved. The cover 103 has a cover surface 107 having a second surface curvature corresponding to the concave shape of the cover 103.

Due to the different surface curvatures of the display surface 105 and the cover surface 107, a spacing d between the display surface 105 and the cover surface 107 varies for different points on the display surface 105.

The display device 100 comprises a display frame 115. The display frame 115 is made from aluminum. The display frame 115 is connected to the cover 103 and the display substrate 102.

The display device 100 comprises a spacer 104 having spacer parts 104a, 104b. The spacer parts 104a, 104b are preformed from glass. The spacer parts 104a, 104b are made from glass, preferably from the same kind of glass as the transparent cover 103. Thus, the spacer parts 104a, 104b have similar, in particular the same, optical properties as the cover 103. This minimizes optical distortions, in particular reflections.

The spacer parts 104a, 104b are positioned to face different surface sections of the display surface 105 and the cover surface 107. The spacer parts 104a, 104b are positioned in surface sections where the spacing d between the display surface 105 and the cover surface 107 is particularly large. The spacer 104 formed by the spacer parts 104a, 104b thus stabilizes the connection between the display substrate 102 and the cover 103.

The spacer parts 104a, 104b each have a first spacer surface 108 and a second spacer surface 109. The first spacer surface 108 faces the display surface 105 and has a first spacer surface curvature corresponding to the first surface curvature of the display surface 105 in the respective surface section. The second spacer surface 109 faces the cover surface 107 and has a second spacer surface curvature corresponding to the second surface curvature of the cover surface 107 in the respective surface section.

The spacer parts 104a, 104b are mechanically connected to the frame 115 by respective connectors 116. Suitable connectors 116 may for example be screws, bolts, snap-in members and/or pressfit members. The spacer parts 104a, 104b are mechanically attached to the cover 103 and the display substrate 102 via the display frame 115. The spacer parts 104a, 104b are held by the frame 115.

The spacer parts 104a, 104b are further attached to the display substrate 102 and the cover 103 by bonding material 112. The bonding material 112 may be in the form of an optical clear resin (OCR). The bonding material 112 bonds the first spacer surface 108 to the display surface 105 and the second spacer surface 109 to the cover surface 107. The combination of mechanical attachment and bonding results in a particular stable display device 100. Further, the bonding material 112 fills gaps between the spacer parts 104a, 104b and the cover 103 and the display substrate 102. Thus, air gaps and other inclusions are reliably avoided.

Figure 6:
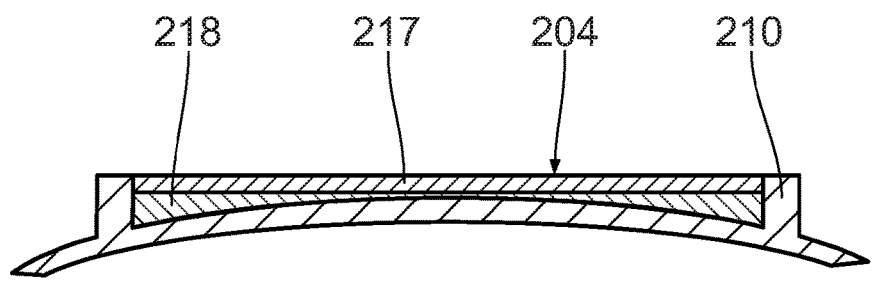
FIG. 6 shows a schematic depiction of the method step of preforming a spacer in accordance with a further embodiment.

With reference to FIG. 6, a further embodiment of a spacer 204 is described together with a method step of preforming the spacer 204.

The spacer 204 is preformed in a mold 210 which corresponds to the mold described with reference to FIG. 1. The spacer 204 comprises two spacer segments 217, 218 in the form of spacer layers. The spacer segments 217, 218 are formed from different materials. At least one of the spacer segments 217, 218 comprises a high refractive index material, in particular a phenyl silicone.

The spacer segments 217, 218 have different optical properties, in particular different refractive indices. Combining the spacer segments 217, 218 allows to locally vary the optical properties of the spacer 204, in particular to gradually adapt the optical properties.

The spacer segments 217, 218 are formed layer by layer in the mold 210. Material for forming the first spacer segment 218 is filled in the mold 210 and cured. Subsequently, material for forming the second spacer segment 217 is filled in the mold 210 and cured.

In other embodiments, the spacer can comprise more than two spacer segments, in particular more than two spacer layers. This allows for an even more finely graduated variation of the optical properties, in particular of the refractive index. It is further possible that active layers, in particular functioning foils, are layered in between different spacer layers. For example, electrochromic foils can be layered in between two spacer layers to allow for a controllable hue and/or shading of the spacer.

In other embodiments, the spacer and the transparent cover are provided and attached to each other in a single step. For example, the spacer and the transparent cover can be provided as a single part. The spacer and the transparent cover can be integrally manufactured, for example by injection molding. The spacer and the transparent cover can be manufactured from the same material, in particular suitable plastics. It is also possible to integrally manufacture the spacer and the transparent cover from different materials, e.g. by 2-component injection molding.

What is claimed is:

1. A method for manufacturing a display device, comprising the steps of
   providing a display substrate having a display surface, wherein the display surface has a first surface curvature,
   providing a cover having a cover surface, wherein the cover surface has a second surface curvature different from the first surface curvature,
   providing a spacer having a first spacer surface and a second spacer surface, wherein the first spacer surface has a first spacer surface curvature being adapted to the first surface curvature of the display substrate and wherein the second spacer surface has a second spacer surface curvature being adapted to the second surface curvature of the cover surface,
   attaching the spacer to the cover with an adhesive layer so that the second spacer surface faces the cover surface, and
   attaching the spacer to the display substrate with an adhesive layer so that the first spacer surface faces the display surface.

2. The method according to claim 1, wherein providing the spacer comprises preforming the spacer from at least one the materials belonging to the group of glass, plastic and a curable bonding material.

3. The method according to claim 2, wherein preforming the spacer comprises forming at least two spacer segments having different optical properties.

4. The method according to claim 3, wherein at least to spacer segments comprise at least two spacer layers.

5. The method according to claim 3, wherein the at least two spacer segments have different refractive indices.

6. The method according to claim 5, wherein at least one spacer segment comprises a high refractive index material.

7. The method according to claim 6, wherein the at least one spacer segment comprises a phenyl silicone.

8. The method according to claim 1, wherein providing the cover comprises bending the cover to obtain the second surface curvature of the cover surface.

9. The method according to claim 1, wherein attaching the spacer to the display substrate comprises bonding the first spacer surface to the display surface.

10. The method according to claim 1, wherein attaching the spacer to the cover comprises bonding the second spacer surface to the cover surface.

11. The method according to claim 1, wherein the spacer is mechanically attached to a display frame.

12. The method according to claim 1, wherein the spacer comprises at least two spacer parts which each are attached to the display substrate and the cover so that different spacer parts face different surface sections of at least one of the display surface and the cover surface.

13. A display device, obtained by a method according to claim 1.

14. A display device, comprising
   a display substrate having a display surface, wherein the display surface has a first surface curvature,
   a cover having a cover surface, wherein the cover surface has a second surface curvature different from the first surface curvature, and
   a spacer having a first spacer surface and a second spacer surface, wherein the first spacer surface has a first spacer surface curvature being adapted to the first surface curvature of the display substrate and wherein the second spacer surface has a second spacer surface curvature being adapted to the second surface curvature of the cover surface,
   wherein the spacer is attached to the display substrate with an adhesive layer so that the first spacer surface faces the display surface, and
   wherein the spacer is attached to the cover with an adhesive layer so that the second spacer surface faces the cover surface.

15. The display device according to claim 14, wherein the spacer is made from at least one the materials belonging to the group of glass, plastic and a cured optical bonding material.

16. The display device according to claim 14, wherein the first spacer surface is bonded to the display surface.

17. The display device according to claim 14, wherein the second spacer surface is bonded to the cover surface.

18. The display device according to claim 14, further comprising a display frame, wherein the spacer is mechanically attached to the display frame.

19. The display device according to claim 14, wherein the spacer comprises at least two spacer segments having different optical properties.

20. The display device according to claim 19, wherein the at least two spacer segments comprise at least two spacer layers.

21. The display device according to claim 19, wherein the at least two spacer segments have different refractive indices.

22. The display device according to claim 14, wherein the spacer comprises at least two spacer parts, wherein different spacer parts are positioned to face different surface sections of at least one of the display surface and the cover surface.

* * * * *